(12) United States Patent
Limketkai et al.

(10) Patent No.: US 8,294,858 B2
(45) Date of Patent: Oct. 23, 2012

(54) INTEGRATED PHOTOVOLTAIC CELL FOR DISPLAY DEVICE

(75) Inventors: Benjie Limketkai, Seattle, WA (US); Ming Zhang, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 400 days.

(21) Appl. No.: 12/415,849

(22) Filed: Mar. 31, 2009

(65) Prior Publication Data

US 2010/0245731 A1  Sep. 30, 2010

(51) Int. Cl.
  *G02F 1/1335* (2006.01)
  *G02F 1/133* (2006.01)
  *H01L 31/042* (2006.01)
  *H01L 31/00* (2006.01)

(52) U.S. Cl. ......... 349/116; 349/106; 136/244; 136/256

(58) Field of Classification Search .................... 349/116
  See application file for complete search history.

(56) References Cited

U.S. PATENT DOCUMENTS

| | | | |
|---|---|---|---|
| 4,175,981 A * | 11/1979 | Loutfy et al. | 136/255 |
| 5,435,087 A | 7/1995 | Karkar et al. | |
| 5,523,776 A | 6/1996 | Hougham et al. | |
| 5,886,688 A | 3/1999 | Fifield et al. | |
| 6,046,401 A | 4/2000 | McCabe | |
| 6,310,282 B1 * | 10/2001 | Sakurai et al. | 136/263 |
| 6,452,088 B1 * | 9/2002 | Schmidt | 136/244 |
| 6,821,649 B2 * | 11/2004 | Kambe et al. | 428/690 |
| 7,136,138 B1 * | 11/2006 | Sekiguchi et al. | 349/162 |
| 7,453,200 B2 * | 11/2008 | Jou et al. | 313/504 |
| 2002/0027620 A1 | 3/2002 | Platz et al. | |
| 2002/0084973 A1 * | 7/2002 | Choi et al. | 345/102 |
| 2007/0068569 A1 | 3/2007 | Nam et al. | |
| 2007/0102035 A1 * | 5/2007 | Yang | 136/244 |
| 2007/0295385 A1 * | 12/2007 | Sheats et al. | 136/251 |
| 2008/0094025 A1 | 4/2008 | Rosenblatt et al. | |
| 2009/0071538 A1 | 3/2009 | Lee et al. | |
| 2009/0129090 A1 * | 5/2009 | Okada | 362/253 |
| 2009/0215105 A1 * | 8/2009 | Hammer et al. | 435/29 |
| 2010/0297798 A1 * | 11/2010 | Adriani et al. | 438/64 |
| 2010/0319776 A1 | 12/2010 | Choe et al. | |

(Continued)

FOREIGN PATENT DOCUMENTS

EP  0218997  4/1987

(Continued)

OTHER PUBLICATIONS

Yang, Chih-Jen, et al., "Organic Light-emitting Devices Integrated with Solar Cells: High Contrast and Energy Recycling," Applied Physics Letters 90, 173507(2007), 0003-6951/2007/90(17)173507/3, Downloaded Feb. 19, 2009, 3 pages.

(Continued)

*Primary Examiner* — Michelle R Connelly
(74) *Attorney, Agent, or Firm* — Blakely, Sokoloff, Taylor & Zafman LLP

(57) ABSTRACT

Embodiments of the present invention describe a photovoltaic cell integrated into a display device. The photovoltaic cell is designed with an absorption spectrum that does not include a range of wavelengths corresponding to a particular color of visible light. Besides having the capability to harvest light, the photovoltaic cell can also function as a color filter and a photodetector.

20 Claims, 7 Drawing Sheets

U.S. PATENT DOCUMENTS

2011/0063392 A1* 3/2011 Wu et al. .............. 347/172

FOREIGN PATENT DOCUMENTS

| EP | 1449902 | | | 8/2004 |
|---|---|---|---|---|
| JP | 11-295726 | | | 10/1999 |
| JP | 2001-141570 | | | 5/2001 |
| JP | 2009188409 | A | * | 8/2009 |
| WO | WO 02101838 | A1 | * | 12/2002 |
| WO | WO-2009052324 | | | 4/2009 |

OTHER PUBLICATIONS

"Solar Cell in LCD Module," Technical Disclosure, IP.com PriorArtDatabase, IPCOM000013695D, Apr. 1, 2000 (Original Publication Date), Jun. 18, 2003 (IP.com Electronic Publication), www.ip.com, 3 pages.

"Method for a Laptop with a Solar Panel Integrated into the LCD," Technical Disclosure, IP.com PriorArtDatabase, IPCOM000011845D, Mar. 19, 2003 (IP.com Electronic Publication), www.ip.com, 3 pages.

Search and Examination Report for United Kingdom Patent Application No. GB1005304.9 mailed Jul. 28, 2010.

"English Translation of the Notice of Preliminary Rejection", Korean Patent Appln. No. 2010-0029512, *Office Action Summary*, pp. 1-4 Mailed from the Foreign Associate Sep. 22, 2011.

"Translation of an Office Action of Japan Patent Office." "Notice of Reasons for Refusal, Official Action". Japanese Patent No. 2010-073981, Mailing Date Jul. 3, 2012, 5 pages.

* cited by examiner

INTEGRATED PHOTOVOLTAIC CELL FOR DISPLAY DEVICE

BACKGROUND

1. Field

One or more embodiments of the present invention relate to the field of display devices and more particularly to a display device comprising integrated photovoltaic cells.

2. Discussion of Related Art

Photovoltaic cells or solar cells are commonly implemented in modern electronic devices to provide an alternative source of energy. In display devices, such as the liquid crystal display (LCD), photovoltaic cells have been integrated into the LCD to harvest electrical energy from ambient light or light generated from a backlight source.

FIG. 1 illustrates a cross-sectional view of a conventional LCD 100 in an unassembled configuration. The LCD 100 comprises a white light source 120, and a horizontal polarizer 131 over the white light source 120. Photovoltaic cells 171, 172, 173 are formed above the horizontal polarizer 131. A pixel 140 comprising subpixels 141, 142, 143 is formed above the photovoltaic cells 171, 172, 173. Color filters 151, 152, 153 are formed on the subpixels 141, 142, 143. The color filters 151, 152, 153 can be made of a red filter 151, a green filter 152, and a blue filter 153 to create a multi-color pixel. A vertical polarizer 132 is formed on the color filters 151, 152, 153. A glass screen 160 is formed on the front vertical polarizer 132.

Typically, the photovoltaic cells 171, 172 173 are formed behind the pixel 140. The photovoltaic cells 171, 172, 173 are able to absorb most of the white light 30 emitted from the white light source 120 when the LCD 100 is turned on. The photovoltaic cells 171, 172, 173 are made of transparent or semi-transparent material so that the emitted white light 30 can be transmitted to the pixel 140. However, one drawback of this configuration is the photovoltaic cells 170 not being able to absorb the ambient light 20 effectively. The intensity of ambient light 20 is significantly reduced after passing through the front vertical polarizer 132, the color filters 151, 152, 153 and the subpixels 141, 142, 143, thus resulting in the photovoltaic cells 170 absorbing only a small amount of ambient light.

DETAILED DESCRIPTION

In the following description, numerous specific details are set forth in order to provide a thorough understanding of one or more embodiments of the present invention. In other instances, well known functionality and features of display devices have not been described in particular detail in order not to unnecessarily obscure this detailed description.

Embodiments of the present invention describe a display device comprising a pixel and a photovoltaic cell over the pixel to absorb light. The photovoltaic cell has a visible light absorption spectrum that does not include a range of wavelengths corresponding to a specific color of visible light. Besides having the capability to harvest light energy, the photovoltaic cell also functions as a color filter and photodetector.

Figure 1:
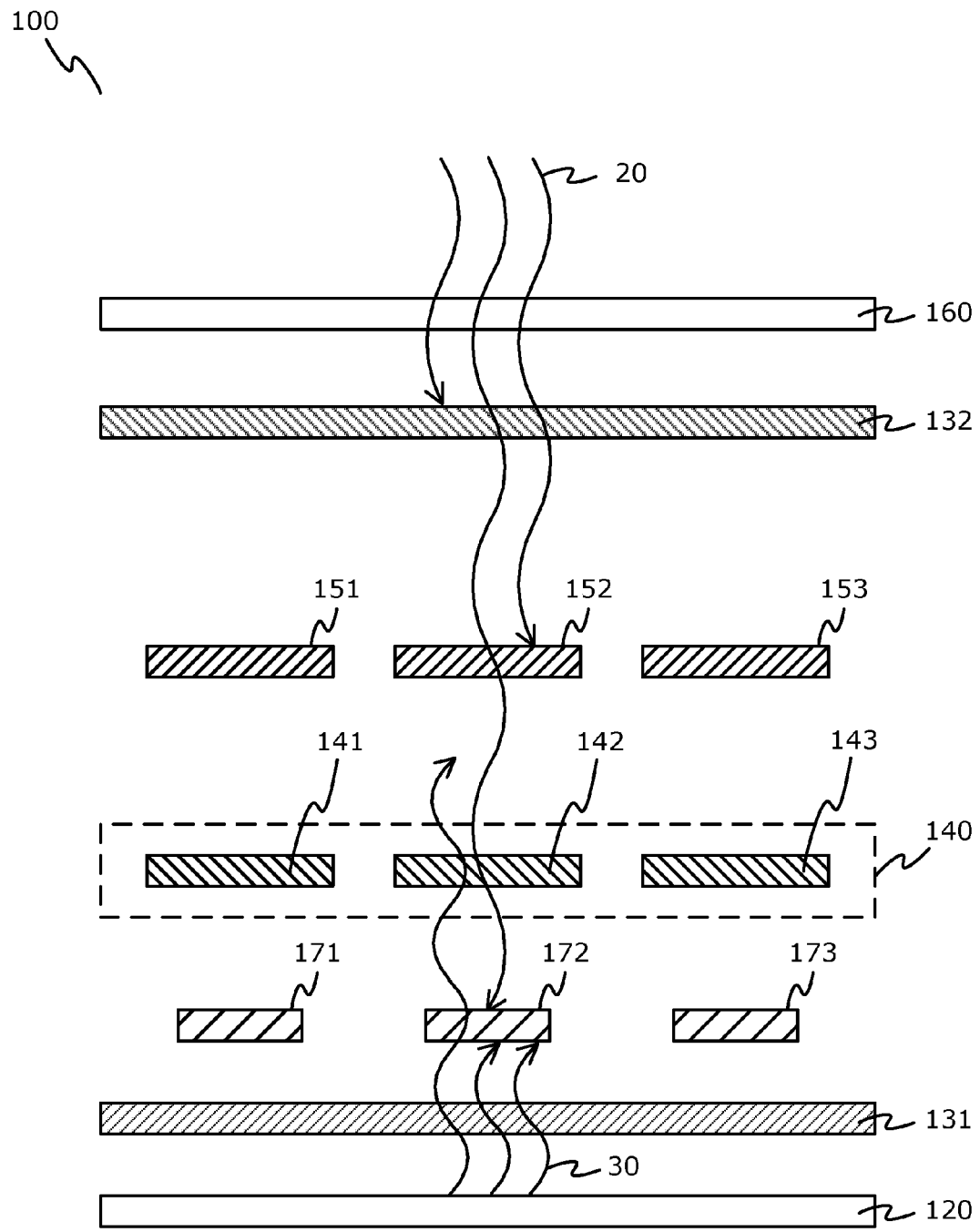
FIG. 1 is a cross-sectional view that illustrates a conventional liquid crystal display (LCD) in an unassembled configuration.
Figure 2:
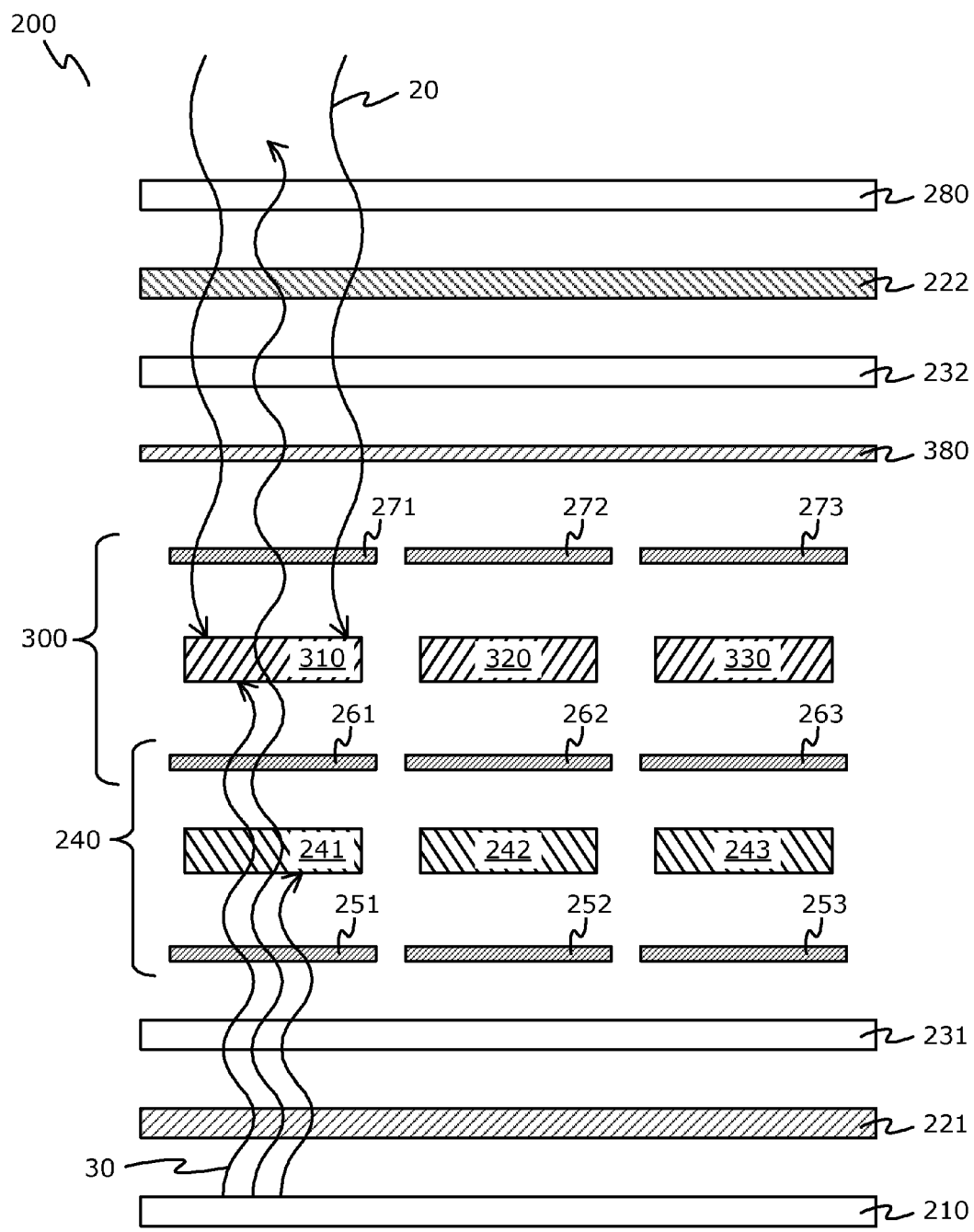
FIG. 2 is a cross-sectional view that illustrates a liquid crystal display (LCD) apparatus in an unassembled configuration in accordance with one embodiment of the present invention.

FIG. 2 illustrates a cross-sectional view of a liquid crystal display (LCD) apparatus 200 in an unassembled configuration. In one embodiment, the LCD apparatus 200 can be implemented as a display for platforms such as but not limited to mobile phones, Personal Digital Assistants (PDA), Mobile Internet Devices (MID), Ultra Mobile Personal Computers (UMPC), laptops, and LCD monitors.

In one embodiment, the LCD apparatus 200 comprises a horizontal polarizer 221 over a backlight module 210. In one embodiment, the backlight module 210 emits white light. The LCD apparatus 200 further comprises a lower glass substrate 231 over the rear horizontal polarizer 221.

In an embodiment of the present invention, a pixel unit 240 is over the lower glass substrate 231. It can be appreciated that the LCD apparatus 200 comprises an array or plurality of pixels but for illustration purposes FIG. 2 only shows one pixel unit 240. In one embodiment, the pixel unit 240 comprises a first subpixel, a second subpixel and a third subpixel. Each of the first, second and third subpixels comprises a liquid crystal layer 241/242/243 between a common electrode 261/262/263 and a pixel electrode 251/252/253. For example, the first subpixel comprises the liquid crystal 261 between the common electrode 261 and the pixel electrode 251. In one embodiment, the common electrodes 261-263 are formed as a single, continuous electrode layer while the pixel electrodes 251-253 are formed as separated, insulated layers and vice versa. In one embodiment, the pixel electrodes 251-253 and common electrodes 261-263 are made from a transparent material such as but not limited to indium tin oxide (ITO).

In an embodiment of the present invention, a photovoltaic unit 300 is over the pixel unit 240 in the LCD apparatus 200. In the case where the LCD apparatus 200 comprises a plurality of pixels, a photovoltaic unit 300 is over every pixel. Alternatively, a plurality of photovoltaic units 300 is over a portion of the plurality of pixels. In one embodiment, the photovoltaic unit 300 comprises a first photovoltaic cell, a second photovoltaic cell, and a third photovoltaic cell. In one embodiment, the first, second and third photovoltaic cells are over the first, second and third subpixels respectively. Each of the first, second and third photovoltaic cells comprises a photovoltaic layer 310/320/330 between a photovoltaic electrode 271/272/273 and a common electrode 261/262/263. For example, the first photovoltaic cell comprises the photovoltaic layer 310 between the photovoltaic electrode 271 and the common electrode 261. In one embodiment, photovoltaic electrodes 271-273 are made from a transparent material such as but not limited to indium tin oxide (ITO).

In an embodiment of the present invention, the LCD apparatus 200 further comprises a barrier layer 380 to encapsulate the photovoltaic unit 300. The barrier layer 380 is made from a material such as but not limited to polyethylene terephthalate (PET). In one embodiment, the barrier layer 380 has a thickness of about 1 to 500 micrometers. The LCD apparatus 200 further comprises an upper glass substrate 232 over the barrier layer 380. In one embodiment, integrating the photovoltaic unit 300 onto the pixel unit 240 instead of the upper glass substrate 232 enables the photovoltaic unit 300 to be formed in the same process flow during the fabrication of the pixel 240. This reduces the manufacturing costs and complexity. In an alternative embodiment, the LCD apparatus 200 does not include the barrier layer 380 if the photovoltaic unit 300 is beneath the upper glass substrate 232. In one embodiment, the LCD apparatus 200 further comprises a front vertical polarizer 222 over the upper glass substrate. In one embodiment, a display or glass screen 280 is over the vertical polarizer 222 to provide a protective cover or screen for the LCD apparatus 200.

In another embodiment, the photovoltaic unit 300 is over the upper glass substrate 232. In this case, the barrier layer 380 encapsulates the photovoltaic unit 300 to provide a protective cover.

The photovoltaic unit has the capability to absorb light and function as a color filter. In an embodiment of the present invention, each of the first, second and third photovoltaic cells are tuned with specific absorption spectrums that are transparent to desired colors. In other words, the first, second and third photovoltaic cells are fabricated with a visible light absorption spectrum that does not include a range of wavelengths associated with a primary color. In one embodiment, the first, second and third photovoltaic cells are designed according to the primary color scheme of red, green and blue. For example, the first photovoltaic cell is designed to substantially absorb the entire spectrum of visible light except the wavelengths corresponding to the color red (i.e. the first photovoltaic cell is transparent to red). Similarly, the second photovoltaic cell is designed to absorb entire spectrum of visible light except the wavelengths corresponding to the color green. Also, the third photovoltaic cell is designed to absorb entire spectrum of visible light except the wavelengths corresponding to the color blue. Although the red, green, blue color scheme is described here, it can be appreciated that other color schemes can be implemented.

Furthermore, the pixel unit 240 is a multi-color pixel if the first, second and third photovoltaic cells use a red, green, and blue primary color scheme. In another embodiment, the pixel unit 240 is a single color pixel, wherein the first, second and third photovoltaic cells are designed according to a single color scheme. For example, the first, second and third photovoltaic cells are all designed to absorb entire spectrum of visible light except the wavelengths corresponding to a single color red. It can be appreciated that the single color is not limited to red but also includes any other colors from the visible light spectrum.

In an embodiment of the present invention, the photovoltaic unit 300 is over the pixel unit 240 as shown in FIG. 2 to absorb most of the ambient light 20 transmitted through the display screen 280. The first, second and third photovoltaic cells of the photovoltaic unit 300 absorb energy from the ambient light 20 and convert it into electrical energy. As a matter of illustration, FIG. 2 only shows the ambient light 20 transmitted to the first photovoltaic cell. In the case where the first photovoltaic cell is tuned to be transparent to the color red, it absorbs energy from the ambient light 20 except from the range of wavelengths corresponding to the color red. Similarly, the second and third photovoltaic cells, if tuned to be transparent to the colors green and blue respectively, absorb energy from the ambient light 20 except the range of wavelengths corresponding to the colors green and blue.

Furthermore, during operation of the LCD apparatus 200, the backlight module 210 is powered on and it emits white light 30 that passes through the horizontal polarizer 221 and lower glass substrate 231 to the pixel unit 240. For illustration purposes, only the portion of white light 30 emitted to the first subpixel is shown in FIG. 2. The liquid crystal layers 241-243 can control the amount of white light 30 transmitted to the display screen 280 according to the amount of voltage applied to the pixel electrodes 251-253.

In one embodiment, the photovoltaic unit 300 absorbs a portion of the white light 30 transmitted through the pixel unit 240. For example, the first photovoltaic cell, if it is tuned to be transparent to the color red, absorbs the white light 30 transmitted through the first subpixel except for the range of wavelengths corresponding to the color red. In other words, the range of wavelengths associated with the color red from the white light 30 are allowed to pass through the first photovoltaic cell and travel to the display screen 280. The energy from the remaining range of wavelengths of the white light 30 not associated with the color red are absorbed by the first photovoltaic cell and converted into electrical energy. The same working principles apply to the second and third photovoltaic cells. The second photovoltaic cell, if it is tuned to be transparent to the color green, allows the range of wavelengths associated with the color green from the white light 30 to pass through and travel to the display screen 280. Similarly, the third photovoltaic cell, when tuned to be transparent to the color blue, allows the range of wavelengths associated with the color blue from the white light 30 to pass through. At the same time, the second and third photovoltaic cells absorb energy from the remaining range of wavelengths not associated with the color green or blue of the white light 30 and convert it into electrical energy.

Figure 3:
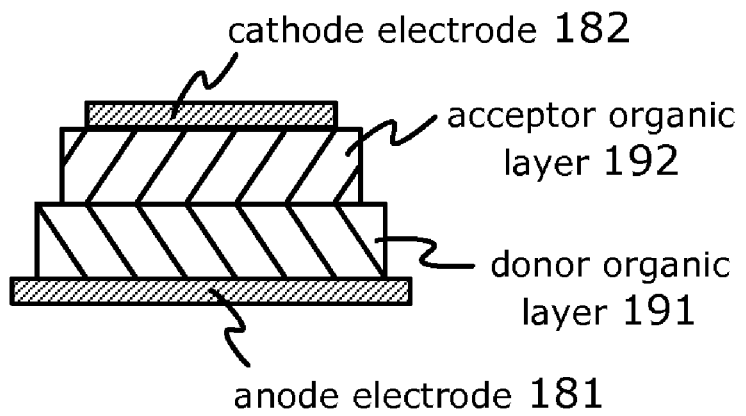
FIG. 3 is a cross-sectional view that illustrates the structure of a conventional organic photovoltaic cell.
Figure 4:
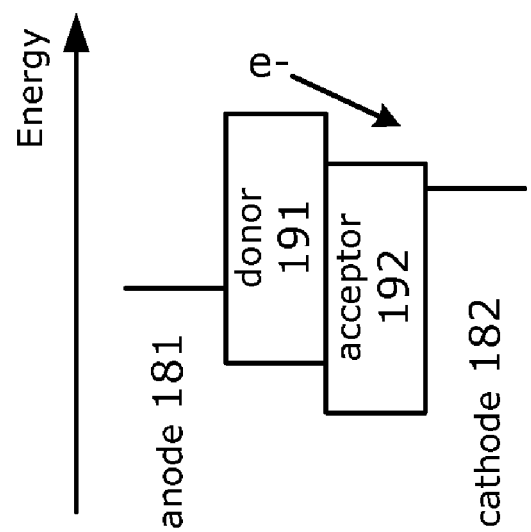
FIG. 4 illustrates an energy band diagram of the conventional organic photovoltaic cell of FIG. 3.

FIG. 3 illustrates the structure of a conventional photovoltaic cell. The conventional photovoltaic cell is an organic photovoltaic cell comprising an anode electrode 181, a donor organic layer 191 formed on the anode electrode 181, an acceptor organic layer 192 formed on the donor organic layer 191, and a cathode electrode 182 formed on the donor organic layer 192. FIG. 4 illustrates an energy band diagram of the conventional photovoltaic cell of FIG. 3. The energy levels of the donor and acceptor organic layers 191, 192 are designed in such a way that there is an energy gradient for the electrons (e−) to move from the anode electrode 181 to the cathode electrode 182. In other words, the donor organic layer 191 "donates" electrons and the acceptor organic layer 192 "accepts" electrons.

The conventional photovoltaic cell absorbs photons to generate electron-hole pairs, which subsequently diffuses and becomes disassociated at the donor-acceptor interface where there is a sharp energy step. Under an applied bias, the electron-hole pairs split apart and the electrons move to the cathode electrode 182 and the holes move to the anode electrode 181, thus generating a photocurrent for the photovoltaic cell. In the conventional photovoltaic cell, the donor organic layer 191 is usually made from a material with a small band-gap and a broad absorption band to absorb as much light as possible. In contrast, first, second and third photovoltaic cells of one or more embodiments of the present invention each comprises multiple absorption layers with specific absorption spectrum to absorb wavelengths corresponding to the colors red, green or blue.

Figure 5:
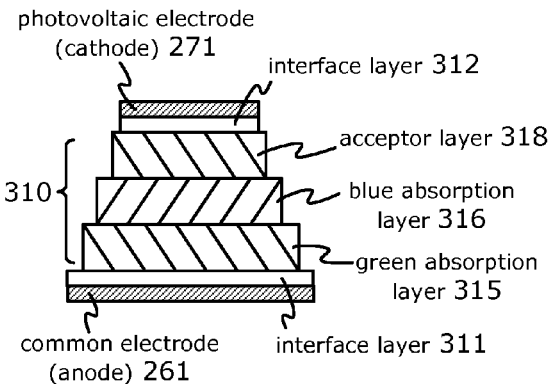
FIG. 5 is a cross-sectional view that illustrates the structure of a first photovoltaic cell in accordance with one embodiment of the present invention.
Figure 6:
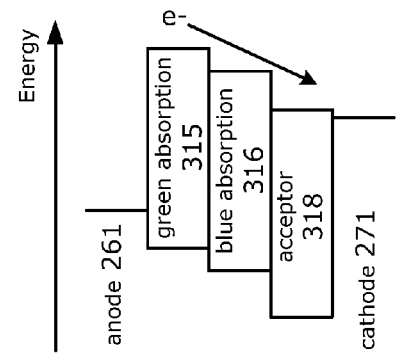
FIG. 6 illustrates an energy band diagram of the first photovoltaic cell of FIG. 5.

FIG. 5 illustrates the structure of the first photovoltaic cell. FIG. 6 shows the corresponding energy band diagram of the structure of FIG. 5. In an embodiment of the present invention, the first photovoltaic cell is an organic photovoltaic cell with a photovoltaic layer 310 comprising a green absorption layer 315 over the common electrode 261, a blue absorption layer 316 over the green absorption layer 315, and an acceptor layer 318 over the green absorption layer 315. The photovoltaic electrode 271 is over the acceptor layer 318. In one embodiment, the photovoltaic electrode 271 functions as the cathode terminal while the common electrode 261 functions as the anode terminal. In another embodiment, the photovoltaic electrode 271 functions as the anode terminal while the common electrode 261 functions as the cathode terminal.

By forming the combination of green and blue absorption layers 315, 316, the first photovoltaic cell has the capability to absorb energy from the range of wavelengths corresponding to the colors green and blue. In other words, the first photovoltaic cell does not absorb energy from the range of wavelengths corresponding to the color red. By allowing the wavelengths associated with the color red to pass through, the first photovoltaic cell provides an additional function as a red color filter for the LCD apparatus 200. This means that the first photovoltaic cell acts as a red color filter for the white light 22 emitted from the backlight module 210 as shown in FIG. 2. As a result, only the wavelengths associated with the color red from the white light 22 is transmitted through the first photovoltaic cell to the display screen 280.

In one embodiment, the green absorption layer 315 has an absorption spectrum with a range of wavelengths corresponding to the color green. In a specific embodiment, the green absorption layer 315 absorbs energy from the range of wavelengths of about 495 to 570 nanometers. In one embodiment, the green absorption layer 315 is made from an organic material such as but not limited to NN'-dimethylquinacridone (DMQA).

In one embodiment, the blue absorption layer 316 has an absorption spectrum with a range of wavelengths corresponding to the color blue. In a specific embodiment, the blue absorption layer 316 absorbs energy from the range of wavelengths of about 350 to 495 nanometers. In one embodiment, the blue absorption layer 316 is made from an organic material such as but not limited to tetra(4-methoxyphenyl) porphine cobalt complex (Co-TPP).

Although FIG. 5 illustrates the first photovoltaic cell having only two absorption layers (i.e. green and blue absorption layers 315, 316), it can be appreciated that the first photovoltaic cell can include additional absorption layers with absorption spectrums for the other colors of visible light. For example, the first photovoltaic cell may include an additional yellow absorption layer having an absorption spectrum with a range of wavelengths corresponding to the color yellow. In this case, the yellow absorption layer is between the common electrode 261 and the green absorption layer 315.

Figure 7:
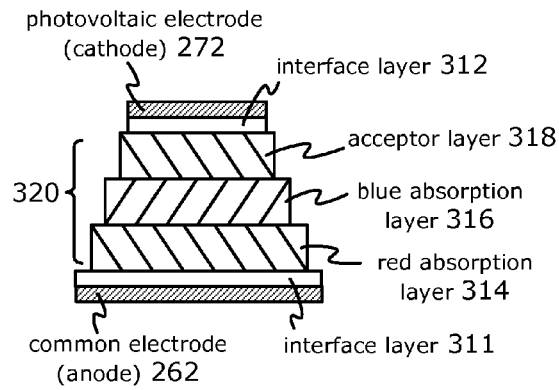
FIG. 7 is a cross-sectional view that illustrates the structure of a second photovoltaic cell in accordance with one embodiment of the present invention.
Figure 8:
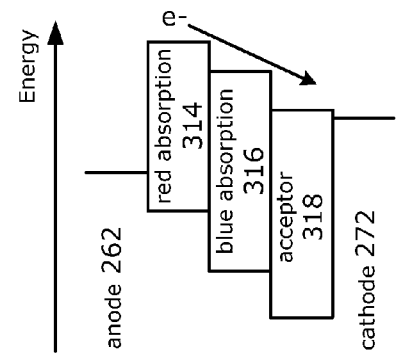
FIG. 8 illustrates an energy band diagram of the second photovoltaic cell of FIG. 7.

FIG. 7 illustrates the structure of the second photovoltaic cell. FIG. 8 shows the corresponding energy band diagram of the structure of FIG. 7. The second photovoltaic cell structure is similar to the first photovoltaic cell shown in FIG. 5 except that a red absorption layer 314 replaces the green absorption layer 315. By using a combination of red and blue absorption layers 314, 316, the second photovoltaic cell has the capability to absorb energy from the range of wavelengths corresponding to the colors red and blue but does not absorb energy from the range of wavelengths corresponding to the color green. Therefore, the second photovoltaic cell allows wavelengths associated with the color green to pass through so as to provide an additional function as a green color filter for the LCD apparatus 200.

In one embodiment, the red absorption layer 314 has an absorption spectrum with a range of wavelengths corresponding to the color red. In a specific embodiment, the red absorption layer 314 absorbs energy from the range of wavelengths of about 570 to 750 nanometers. In one embodiment, the red absorption layer 314 is made from an organic material such as but not limited to zinc phthalocyanine (ZnPC).

Figure 9:
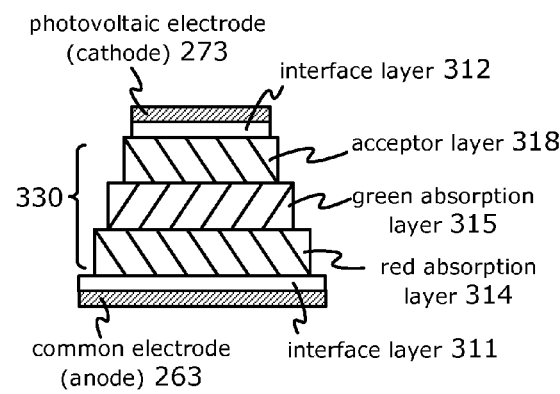
FIG. 9 is a cross-sectional view that illustrates the structure of a third photovoltaic cell in accordance with one embodiment of the present invention.
Figure 10:
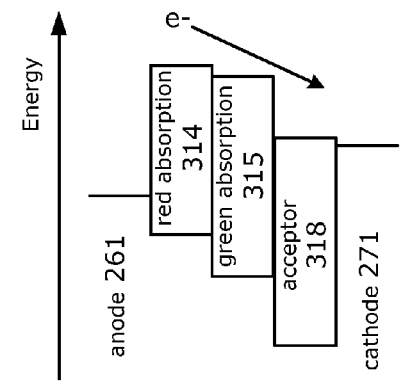
FIG. 10 illustrates an energy band diagram of the third photovoltaic cell of FIG. 9.

FIG. 9 illustrates the structure of the third photovoltaic cell. FIG. 10 shows the corresponding energy band diagram of the structure of FIG. 9. The third photovoltaic cell structure is also similar to the first photovoltaic cell shown in FIG. 5 except that a combination of red and green absorption layers 314, 315 are used. This means that the third photovoltaic cell is able to absorb energy from the range of wavelengths corresponding to the colors red and green but does not absorb energy from the range of wavelengths corresponding to the color blue. Thus, the third photovoltaic cell also functions as a blue color filter for the LCD apparatus.

In one embodiment, the acceptor layer 318 shown in FIGS. 6, 8 and 10 "accepts" electrons and "blocks" holes from moving to the cathode 271/272/273. The acceptor layer is made from a material such as but not limited to naphthalene tetra carboxylic anhydride (NTCDA), 3,4,9,10-perylenetetracarboyxilic bis-benzimidazole (PTCBI), 3,4,9,10-perylene tetracarboxylic acid (PTCDA), bathocuproine (BCP), and fullerene. In a specific embodiment, the acceptor layer is made from c60 fullerene. In an alternative embodiment, the acceptor layer 318 is removed from the structure of the first, second and third photovoltaic cells. In this case, the combination of the absorption layers in each photovoltaic cell functions operates in a donor-acceptor relationship. For example, if the acceptor layer 318 is removed from the first photovoltaic cell shown in FIG. 5, the green absorption layer 315 functions as a "donor" layer and the blue absorption layer 316 functions as an "acceptor" layer. One benefit of removing the acceptor layer 318 is that the overall thickness of the photovoltaic cell is reduced.

In an embodiment of the present invention, each of the first, second and third photovoltaic cells further comprises interface layers 311, 312 as shown in FIGS. 5, 7 and 9. The interface layers 311, 312 can be added to adjust the work function of the charge-collecting electrodes, which in this case refers to the common electrodes 261-263 and the photovoltaic electrodes 271-273. In one embodiment, the interface layers 311, 312 are made from a material such as but not limited to self-assembled monolayers (SAMs) based on saturated alkanethiols and perfluorinated alkanthiols, SAMs based on carboxylic acid with saturated aliphatic and fluorinated aliphatic chains, and SAMs such as lauric acid (LA), mercaptoundecanoic acid (MUA), and perfluorotetradecanoic acid (PFTDA). In another embodiment, the interface layers 311, 312 are made from metal oxides such as vanadium oxide ($V_2O_5$), cesium carbonate ($Cs_2CO_3$), zinc oxide (ZnO), and molybdenum oxide ($MoO_3$).

In one embodiment, the common electrodes 261-263 and the photovoltaic electrodes 271-273 are made from a transparent conducting metal oxide or polymer. In a specific embodiment, the common electrodes 261-263 and photovoltaic electrodes 271-273 are made from indium tin oxide (ITO). The thickness of the common electrodes 261-263 and photovoltaic electrodes 271-273 range from 10 to 100 nanometers. In another embodiment, the common electrodes 261-263 and photovoltaic electrodes 271-273 is made from a metal film having a thickness of about 1 to 10 nanometers.

In an embodiment of the present invention, the thickness of each of the absorption layers 314-316 can be adjusted to vary the amount of light absorbed. However, if the absorption layers 314-316 are too thick, the electrons and holes have to travel a larger distance, which decreases the power conversion efficiency for light-harvesting purposes. Therefore, the absorption layers 314-316 are fabricated with sufficient thickness to absorb a desired amount of light without affecting the power conversion efficiency. In one embodiment, the thickness of each of the absorption layers 314-316 has a range of about 10 to 100 nanometers.

In an alternative embodiment, the absorption layers 314-316 are fabricated with different thicknesses in each of the first, second and third photovoltaic cells to achieve a better quality of color purity. Ideally, the absorption spectrums of the red, green and blue absorption layers 314-316 do not overlap each other so that the photovoltaic unit 300 can produce good color purity. However, the intensity of the colors transmitted by the first, second, and third photovoltaic cells may vary. For example, the first photovoltaic cell (red filter) may transmit a lower amount or intensity of red color as compared to the intensity of green or blue transmitted by the second photovoltaic cell (green filter) and the third photovoltaic cell (blue filter). This could result from the first photovoltaic cell having a green absorption layer 315 that has a broad absorption spectrum that overlaps into a range of wavelengths associated with the color red, hence causing the first photovoltaic cell to absorb a small amount of red color.

In one embodiment, the thickness of the red absorption layer 314 in the second photovoltaic cell shown in FIG. 7 can be adjusted so that its absorption spectrum overlaps a small range of wavelengths associated with the color green. This means that the second photovoltaic cell absorbs a small amount of green color to balance the intensity of green color with the respect to red color transmitted by the first photovoltaic cell. Similarly, the thickness of the green absorption layer 315 in the third photovoltaic cell shown in FIG. 9 can be adjusted so that its absorption spectrum overlaps a small range of wavelengths associated with the color blue. This enables the third photovoltaic cell to absorb a small amount of blue color so as to balance the intensity of blue color with respect to the red color transmitted by the first photovoltaic cell.

Figure 11:
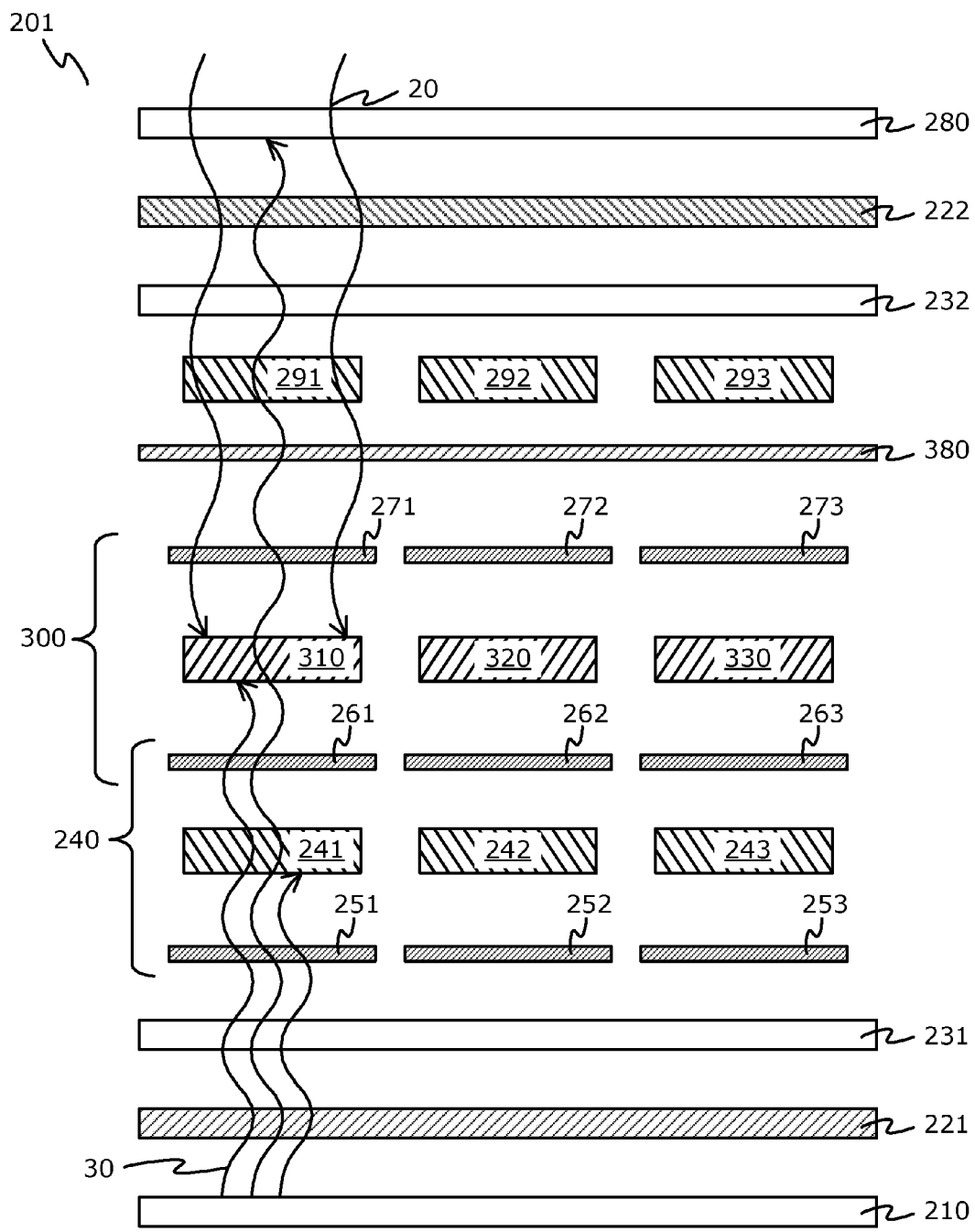
FIG. 11 is a cross-sectional view that illustrates a liquid crystal display (LCD) apparatus in an unassembled configuration in accordance with another embodiment of the present invention.

In another embodiment, additional color filters can be implemented in the LCD apparatus to produce better color purity. In one embodiment, color filters 291, 292, 293 are between the barrier layer 380 and the upper glass substrate 232 as shown in FIG. 11. The LCD apparatus 201 shown in FIG. 11 is similar to the LCD apparatus 200 in FIG. 2 except for the additional color filters 291-293.

In one embodiment, the color filters 291-293 are over above the first, second and third photovoltaic cells respectively. In one embodiment, the color filters 291-293 are fabricated with absorption spectrums having a smaller range of wavelengths compared to the absorption spectrums of the corresponding first, second and third photovoltaic cells. This enables the first, second and third photovoltaic cells to transmit their respective colors much better onto the display screen 280. In the case where the first, second and third photovoltaic cells transmit red, green and blue respectively, the color filter 291 would be a red filter, the color filter 292 would be a green filter, and the color filter 293 would be a blue filter.

Figure 12:
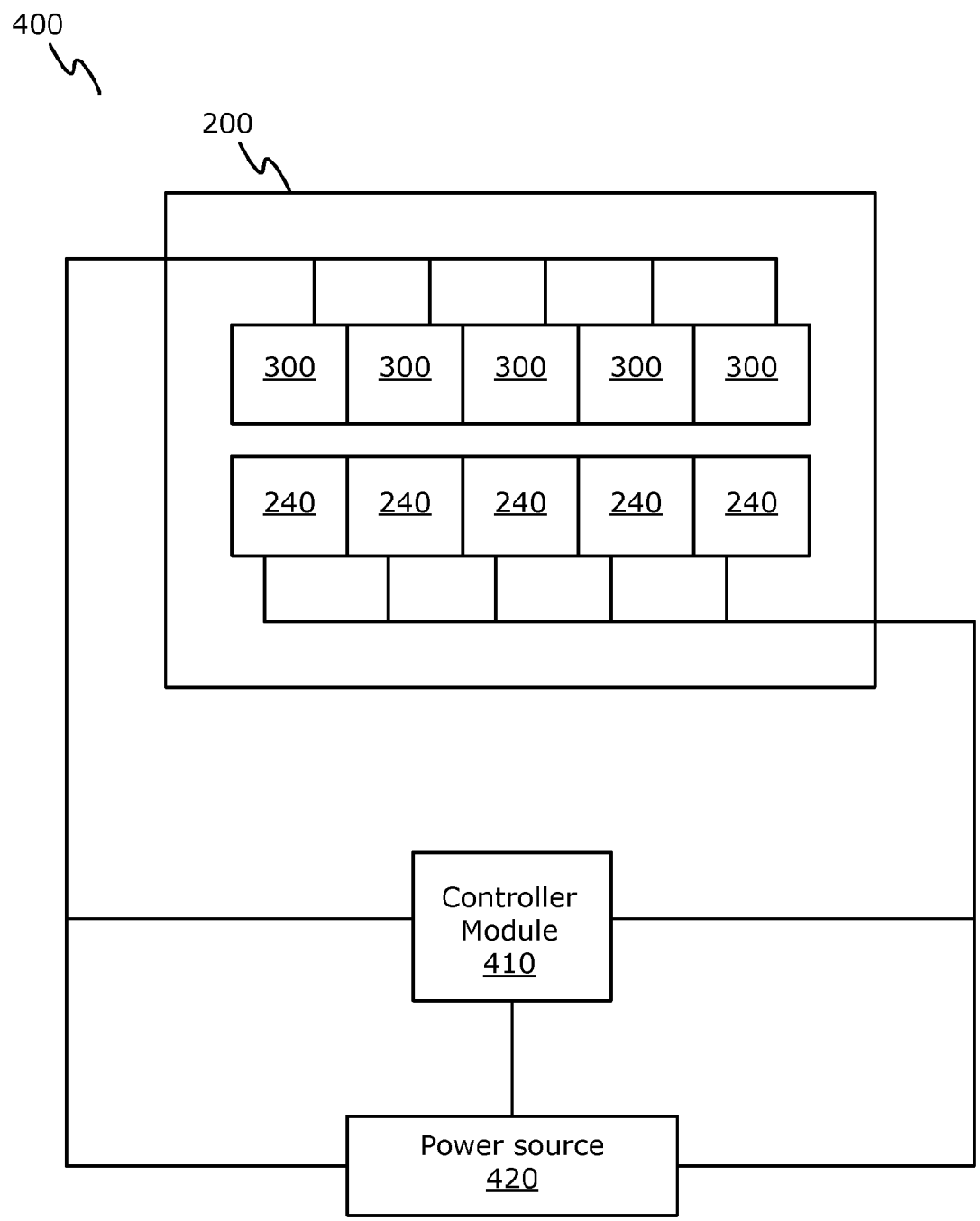
FIG. 12 illustrates a block diagram of a system comprising a LCD apparatus in accordance with one embodiment of the present invention.

FIG. 12 illustrates a block diagram of a system 400 comprising the LCD apparatus 200. In an embodiment of the present invention, the system 400 comprises a controller module 410 coupled to a plurality of pixel units 240 and a plurality of photovoltaic units 300. The system 400 further comprises a power source 420 coupled to the plurality of pixel units 240 and photovoltaic units 300. In one embodiment, the power source 420 is a rechargeable battery.

In one embodiment, the plurality of photovoltaic units 300 has the capability to harvest light energy. When the first, second and third photovoltaic cells of the photovoltaic unit 300 absorb light, they convert the light energy into electrical energy. The electrical energy generated by the first, second and third photovoltaic cells are then delivered to the power source 420. In one embodiment, the power source 420 is coupled to the photovoltaic electrodes 271-273 or the common electrodes 261-263 of every photovoltaic unit 300 to receive and store the generated electrical energy.

In an embodiment of the present invention, each of the plurality of photovoltaic units 300 has the capability to function as a photodetector. In one embodiment, the controller module 410 is coupled to the photovoltaic electrodes 271-273 or the common electrodes 261-263 of every photovoltaic unit 300. The photovoltaic electrodes 271-273 or the common electrodes 261-263 can be patterned into individual rows and columns so that each of the photovoltaic unit 300 is addressable by the controller module 410. This enables the controller module 410 to detect the amount of electrical energy generated by each photovoltaic unit 300.

In one embodiment, the display apparatus 400 has the capability to function as a touch-screen display. In one embodiment, the pixel electrodes 251-253 of the plurality of pixel units 240 is patterned into individual rows and columns so that each pixel unit 240 is addressable by the controller module 410. The controller module 410 monitors the amount of electrical energy generated by each of the photovoltaic unit 300 over a period of time and adjusts the corresponding pixel unit 240 accordingly. For example, if a finger is placed over the left-most photovoltaic unit 300 in FIG. 12, the controller module 410 detects the change in electrical energy generated at the left-most photovoltaic unit 300 and adjusts the intensity of light transmitted by the pixel unit 240 below the left-most photovoltaic unit 300. Depending on how the controller module 410 is programmed, it can detect the change in electrical energy generated in a region of photovoltaic units 300 and instruct the display apparatus 400 to display a relevant image.

Figure 13:
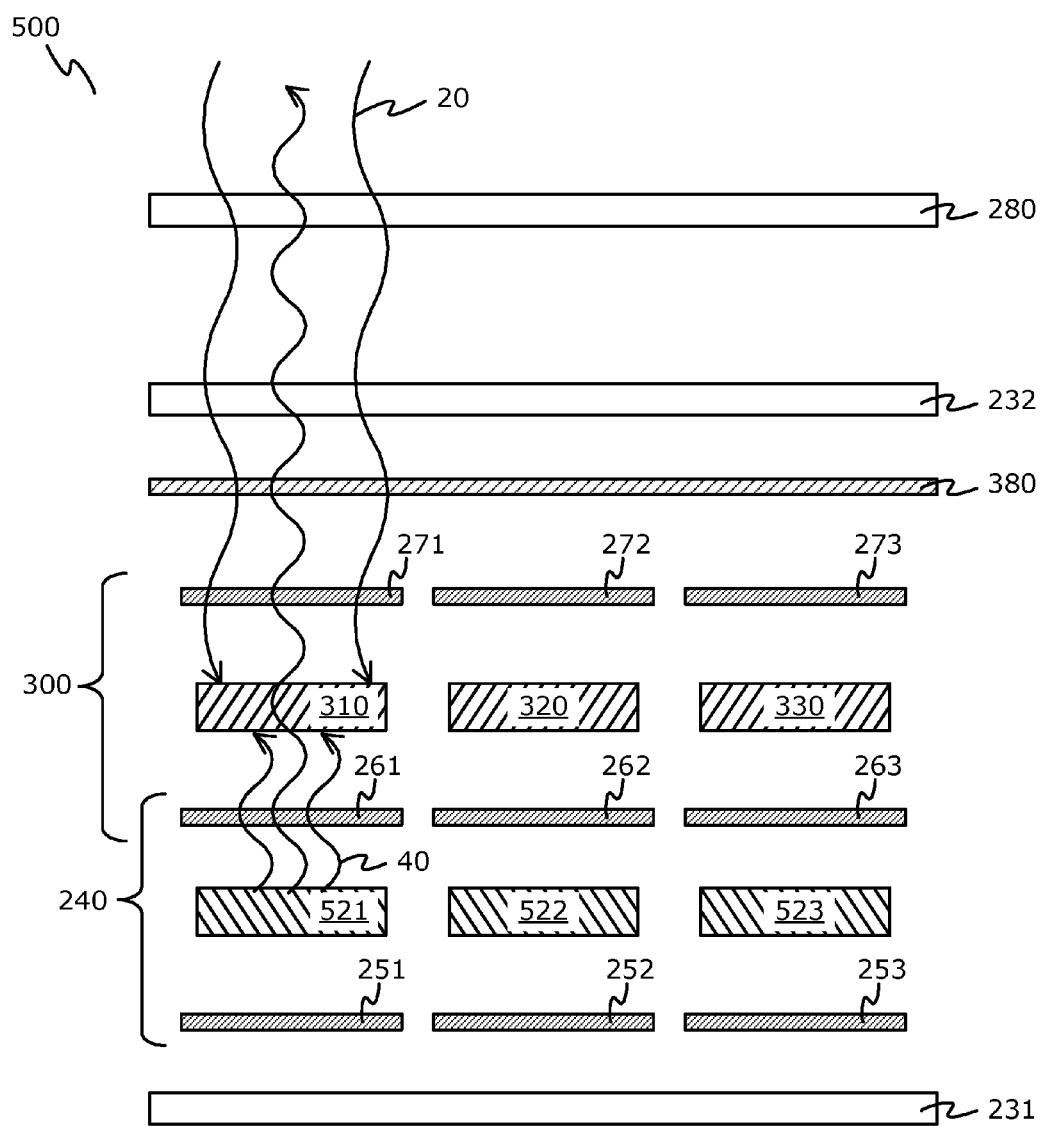
FIG. 13 is a cross-sectional view that illustrates a display apparatus in an unassembled configuration in accordance with one embodiment of the present invention.

FIG. 13 illustrates a cross-sectional view of a display apparatus 500 in an unassembled configuration. In an embodiment of the present invention, the display apparatus 500 can be an organic light emitting diode (OLED) display, a plasma display or an electrophoretic display (EPD). The display apparatus 500 is similar to the LCD apparatus 200 illustrated in FIG. 2 but the display apparatus 500 does not include the backlight module 210, the horizontal polarizer 221 and the vertical polarizer 222.

Similarly, the display apparatus 500 comprises a pixel unit 240 having a first subpixel, a second subpixel and a third pixel over the lower glass substrate 231. The liquid crystal layers 241-243 described in relation to FIG. 2 are now replaced by layers 521, 522, 523. Thus, each of the first, second and third subpixels now comprises a layer 521/522/523 between the common electrode 261/262/263 and the pixel electrode 251/252/253.

In the case where the display apparatus 500 is an OLED display, each of the layers 521-523 is made of organic multi-layers, which are well known and will not be discussed in detail here. For the discussion of the OLED display, the first, second and third subpixels are referred as the first, second and third OLED subpixels. In one embodiment, the first, second and third OLED subpixels are fabricated with different organic multi-layers to emit different colors of light. For example, the first OLED subpixel emits a red color, the second OLED subpixel emits a green color and the third OLED subpixel emits a blue color.

The photovoltaic unit 300 shown in FIG. 13 is the similar to the embodiment described in FIG. 2. Therefore, if the first OLED subpixel emits a red color 40, the first photovoltaic unit above the first OLED subpixel allows red color 40 to pass through and travel to the display screen 280 as shown in FIG. 13. Similarly, the second and third photovoltaic cells will allow the green and blue colors emitted by the second and third OLED subpixels to pass through. Furthermore, the first, second and third photovoltaic cells also absorb the ambient light 20 transmitted through the display screen 280, which was similarly discussed in FIG. 2.

In another embodiment, the first, second and third OLED subpixels are fabricated to emit the same color, such as but not limited to white, red, green or blue. If the first, second, and third OLED subpixels are emitting the same color red, then the first, second and third photovoltaic cells will be fabricated to allow red color to pass through. This means that the second and third photovoltaic cell have the same structure as the first photovoltaic cell shown in FIG. 5.

If the first, second and third OLED subpixels are emitting white color, the same working principles of the first, second and third photovoltaic cell described in relation to FIG. 2 would apply here. Briefly, this means that the first photovoltaic cell absorbs the white light 40 emitted by the first OLED subpixel except the range of wavelengths associated with the color red from the emitted white light. Similarly, the second and third photovoltaic cells absorb the white light emitted by the second and third OLED subpixels except the range of wavelengths associated with the color green or blue from the emitted white light.

In one embodiment, additional color filters are over the first, second and third OLED subpixels. The additional color filters would enable the display apparatus 500 to achieve a better color purity. The fabrication of the color filters into the display apparatus 500 would be similar to the embodiment described in relation to FIG. 11, and thus would not be discussed in detail here. In one embodiment, it would be more desirable to form the color filters if the first, second and third OLED subpixels are emitting white color.

In the case where the display apparatus 500 is a plasma display, each of the layers 521-523 is a plasma cell containing ionized gas. Each of the plasma cells comprises a different color of phosphor coating so that the plasma cells can emit different colors. For the discussion of the plasma display, the first, second and third subpixels are referred to as the first, second and third plasma subpixels.

In one embodiment, the first, second and third plasma subpixels emit different colors of light. For example, the first plasma subpixel emits a red color, the second plasma subpixel emits a green color and the third plasma subpixel emits a blue color. Similarly, the first photovoltaic cell allows red color emitted by the first plasma subpixel to pass through and travel to the display screen 280. At the same time, the first photovoltaic cell absorbs the ambient light transmitted through the display screen 280. Similarly, the second and third photovoltaic cells will allow the green and blue colors emitted by the second and third plasma subpixels to pass through respectively.

In the case where the display apparatus 500 is an EPD display, each of the layers 521-523 comprises a plurality of microcapsules containing colored/pigmented microparticles. The microcapsules are each fabricated with different colors of microparticles so that light incident on the microparticles is either reflected or absorbed. In one embodiment, each of the microcapsules contains white and black pigmented microparticles having opposite charge. In one embodiment, the microcapsule is between a top electrode and a bottom electrode, where the top and bottom electrodes control the movement of the microparticles in the microcapsule based on an applied voltage. In this case, the top and bottom electrodes would be the common electrode 261/262/263 and the pixel electrode 251/252/253 shown in FIG. 13. If the white pigmented microparticles are attracted towards the common electrodes 261-263, any light incident on the white pigmented microparticles is reflected. On the other hand, if the black pigmented microparticles are attracted towards the common electrodes 261-263, any light incident on the black pigmented microparticles is absorbed. Even though the EPD display uses a white and black color scheme, color filters can be implemented above the microcapsules to display color images. For the discussion of the EPD display, the first, second and third subpixels are referred to as the first, second and third EPD subpixels.

During operation of the EPD display, ambient light travels through the display screen 280 and is being absorbed by the first, second and third photovoltaic cells. Since the first photovoltaic cell is transparent to red color, it allows the range of wavelengths associated with the color red from the ambient light to be transmitted to the first EPD subpixel. If the white pigmented microparticles are attracted to the common electrode 261, the light incident on the first EPD subpixel will be reflected back to the first photovoltaic cell, resulting in only the red color passing through the first photovoltaic cell and transmitted to the display screen 280. The same working principles of the first photovoltaic cell and first EPD subpixel apply to the second and third photovoltaic cells and subpixels.

In one embodiment, additional color filters are over the first, second and third EPD subpixels. The fabrication of the color filters would be similar to the embodiment described in relation to FIG. 11, and thus would not be discussed in detail here.

In one embodiment, the display apparatus 500 can also provide photo-detection and touch-screen capabilities. For example, the display device 500 can be implemented in the system 400 shown in FIG. 12 by replacing the LCD apparatus 200. The operations of the controller module 410 and power source 420 are similar to the embodiment described in FIG. 12 and thus will not be discussed here.

Several embodiments of the invention have thus been described. However, those ordinarily skilled in the art will recognize that the invention is not limited to the embodiments described, but can be practiced with modification and alteration within the spirit and scope of the appended claims that follow.

We claim:
1. A display device comprising:
    a controller having one or more pixel units, wherein each pixel unit including a plurality of pixels; and
    a photovoltaic cell over a pixel to absorb light, the photovoltaic cell having a visible light absorption spectrum that does not include a range of wavelengths corresponding to a first color of visible light,
wherein the photovoltaic cell includes a plurality of absorption layers having an ability to harvest light energy, and
wherein one or more of the plurality of absorption layers have sufficient thickness to absorb an amount of light, wherein thickness of each absorption layer is sufficiently adjusted to vary the amount of light absorbed, and wherein the sufficient thickness is such that an absorption spectrum overlaps a range of wavelengths associated with at least one of a second color and a third color so as to absorb an amount of at least one of the second color and the third color.

2. The display device of claim 1, wherein the photovoltaic cell comprises:
a first electrode layer;
a first absorption layer of the plurality of absorption layers over the first electrode layer, the first absorption layer having an absorption spectrum with a range of wavelengths corresponding to a second color of visible light;
a second absorption layer of the plurality of absorption layers over the first absorption layer, the second absorption layer having an absorption spectrum with a range of wavelengths corresponding to a third color of visible light; and
a second electrode layer over the second absorption layer.

3. The display device of claim 2, wherein the first color is green, the second color is red, and the third color is blue.

4. The display device of claim 3, wherein the first absorption layer is made from zinc phthalocyanine (ZnPC).

5. The display device of claim 1, wherein the first color is red, the second color is green, and the third color is blue.

6. The display device of claim 5, wherein the first absorption layer is made from NN'- dimethylquinacridone (DMQA).

7. The display device of claim 5, wherein the second absorption layer is made from tetra (4-methoxyphenyl) porphine cobalt complex (Co-TPP).

8. The display device of claim 5,
wherein the color red has a range of wavelengths from 570 to 750 nanometers,
wherein the color green has a range of wavelengths from 495 to 570 nanometers, and
wherein the color blue has a range of wavelengths from 350 to 495 nanometers.

9. The display device of claim 1, wherein the first color is selected from the group consisting of red, blue or green.

10. The display device of claim 1,
wherein the pixel is to transmit white light to the photovoltaic cell; and
wherein the photovoltaic cell is to absorb the white light transmitted from the pixel except the range of wavelengths from the white light corresponding to the first color.

11. The display device of claim 1,
wherein the pixel is to emit the first color of visible light; and
wherein the photovoltaic cell is not to absorb the range of wavelengths corresponding to the first color of visible light emitted by the pixel.

12. A display apparatus comprising;
a display screen;
a plurality of pixel units to transmit light to the display screen, each pixel unit comprising a first subpixel; and
a plurality of photovoltaic units, wherein a photovoltaic unit of the plurality of photovoltaic units includes a photovoltaic cell having one or more of a first photovoltaic cell, a second photovoltaic cell, and a third photovoltaic cell, wherein the photovoltaic cell includes a plurality of absorption layers having an ability to harvest light energy, wherein one or more of the plurality of absorption layers have sufficient thickness to absorb an amount of light, wherein thickness of each absorption layer is sufficiently adjusted to vary the amount of light absorbed, wherein the sufficient thickness is such that an absorption spectrum overlaps a range of wavelengths associated with at least one of a second color and a third color so as to absorb an amount of at least one of the second color and the third color, the photovoltaic unit comprising:
the first photovoltaic cell between the first subpixel and the display screen, wherein the first photovoltaic cell is to absorb ambient light transmitted through the display screen to generate electrical energy, and wherein the first photovoltaic cell is transparent to a first primary color of light.

13. The display apparatus of claim 12,
wherein each pixel unit further comprises a second subpixel; and
wherein each photovoltaic unit further comprises:
the second photovoltaic cell between the second subpixel and the display screen, wherein the second photovoltaic cell is to absorb ambient light transmitted through the display screen to generate electrical energy, and wherein the second photovoltaic cell is transparent to a second primary color of light.

14. The display apparatus of claim 13,
wherein each pixel unit further comprises a third subpixel; and
wherein each photovoltaic unit further comprises:
the third photovoltaic cell between the third subpixel and the display screen, wherein the third photovoltaic cell is to absorb ambient light transmitted through the display screen to generate electrical energy, and wherein third organic photovoltaic cell is transparent to a third primary color of light.

15. The display apparatus of claim 14, wherein the first primary color of light is red, wherein the second primary color of light is green, and wherein the third primary color of light is blue.

16. The display apparatus of claim 14, further comprising:
a backlight module to emit white light to the plurality of pixel units, wherein the emitted white light from the backlight module is to be transmitted through the first, second and third subpixels onto the first, second and third photovoltaic cells;
wherein the first photovoltaic cell is to absorb the emitted white light transmitted through the first subpixel and generates electrical energy;
wherein the second photovoltaic cell is to absorb the emitted light white transmitted through the second subpixel and generates electrical energy; and
wherein the third photovoltaic cell is to absorb the emitted white light transmitted through the third subpixel and generates electrical energy.

17. The display apparatus of claim 14,
wherein the first subpixel is to transmit the first primary color of light;
wherein the second subpixel is to transmit the second primary color of light; and
wherein the third subpixel is to transmit the third primary color of light.

18. The display apparatus of claim 12, wherein the first primary color of light is selected from the group consisting of red, green or blue.

19. The display apparatus of claim 12, further comprising:
a power source coupled to the plurality of photovoltaic units, wherein the power source is to receive and to store electrical energy generated by the plurality of photovoltaic units.

20. The display apparatus of claim 12, further comprising:
a controller coupled to the plurality of pixel units and the plurality of photovoltaic units,
wherein each photovoltaic unit and the corresponding pixel unit is addressable by the controller, and
wherein the controller is to detect the electrical energy generated by each photovoltaic unit to adjust the amount of light transmitted by the corresponding pixel unit.

* * * * *